United States Patent [19]
Watanabe et al.

[11] Patent Number: 6,086,454
[45] Date of Patent: Jul. 11, 2000

[54] METHOD OF FABRICATING A SEMICONDUCTOR DEVICE USING A CMP PROCESS

[75] Inventors: Yoshio Watanabe; Kenichi Kawashima, both of Kawasaki, Japan

[73] Assignee: Fujitsu Limited, Kawasaki, Japan

[21] Appl. No.: 08/902,278

[22] Filed: Jul. 29, 1997

[30] Foreign Application Priority Data

Nov. 29, 1996 [JP] Japan .................................. 8-320046

[51] Int. Cl.$^7$ ...................................................... B24B 1/00
[52] U.S. Cl. .................................. 451/36; 451/41; 451/54
[58] Field of Search ........................................ 438/692, 693;
451/36, 41, 54, 56, 60, 67, 285, 286, 287, 288, 289, 290, 339, 398

[56] References Cited

U.S. PATENT DOCUMENTS

| | | | |
|---|---|---|---|
| 5,228,886 | 7/1993 | Zipperian | 51/293 |
| 5,616,063 | 4/1997 | Okumura et al. | 451/5 X |
| 5,616,212 | 4/1997 | Isobe | 438/693 |
| 5,643,406 | 7/1997 | Shimomura et al. . | |
| 5,679,060 | 10/1997 | Leonard et al. | 451/5 X |
| 5,725,417 | 3/1998 | Robinson | 451/56 |
| 5,741,173 | 4/1998 | Lundt et al. | 451/56 |
| 5,762,539 | 6/1998 | Nakashiba et al. | 451/5 X |
| 5,763,325 | 6/1998 | Kishii et al. | 438/693 |
| 5,779,520 | 7/1998 | Hayakawa | 451/41 |
| 5,783,489 | 7/1998 | Kaufman | 438/692 |
| 5,803,795 | 9/1998 | Nozawa | 451/35 |
| 5,827,110 | 10/1998 | Yajima et al. | 451/5 |

*Primary Examiner*—Timothy V. Eley
*Attorney, Agent, or Firm*—Armstrong, Westerman, Hattori, McLeland & Naughton

[57] ABSTRACT

A polishing apparatus includes a rotatable platen, a first driving device for causing the rotatable platen to rotate, a polishing head provided above the platen rotatably and holding a substrate in a manner such that the substrate faces the platen, a second driving device for causing the polishing head to rotate, an urging device for urging the substrate on the polishing head against the platen, a slurry feeding system for feeding a slurry to the platen, and a cleaning system for supplying a cleaning liquid containing an acid that dissolves a manganese oxide, to the polishing head. The cleaning system includes a nozzle provided in the polishing head for spraying the cleaning liquid to the platen.

8 Claims, 13 Drawing Sheets

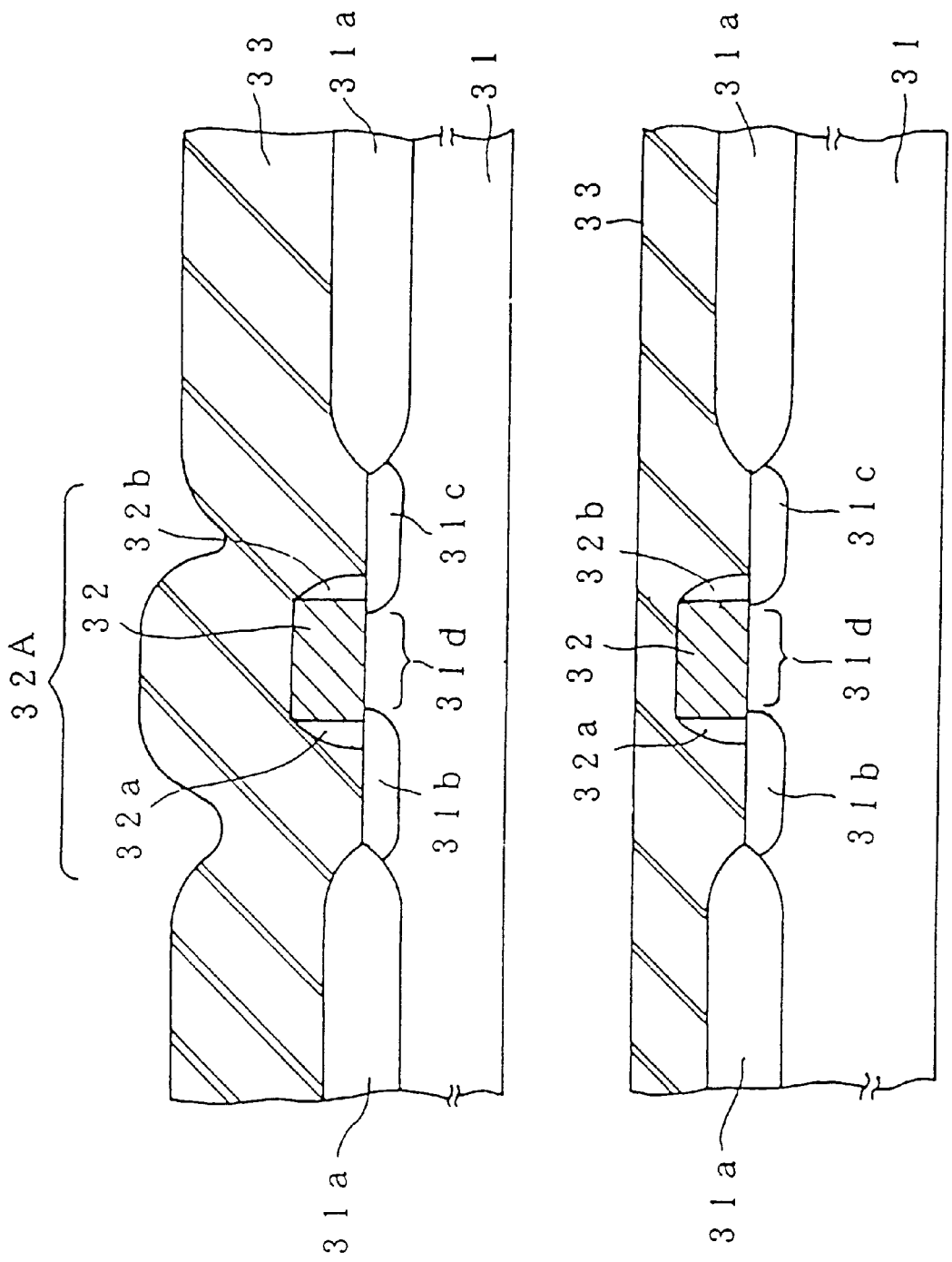

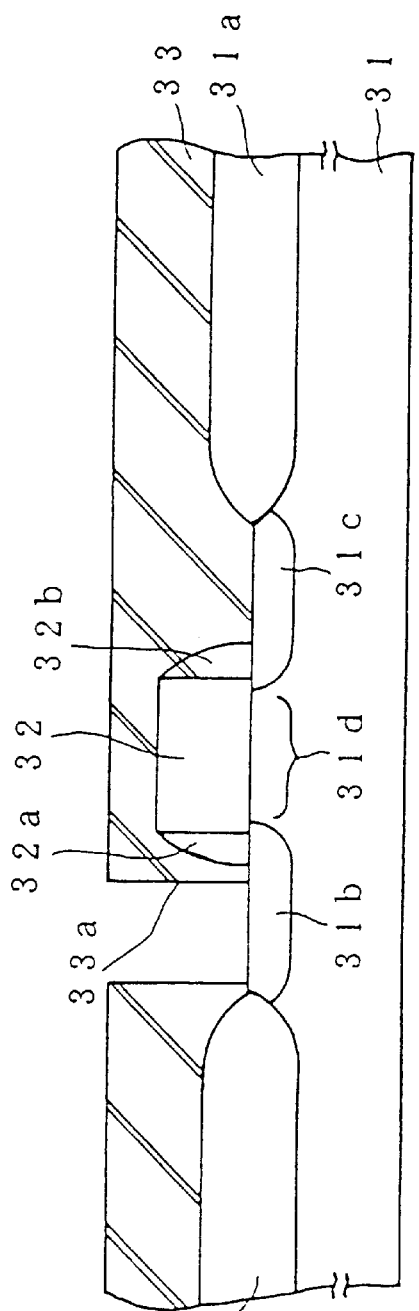
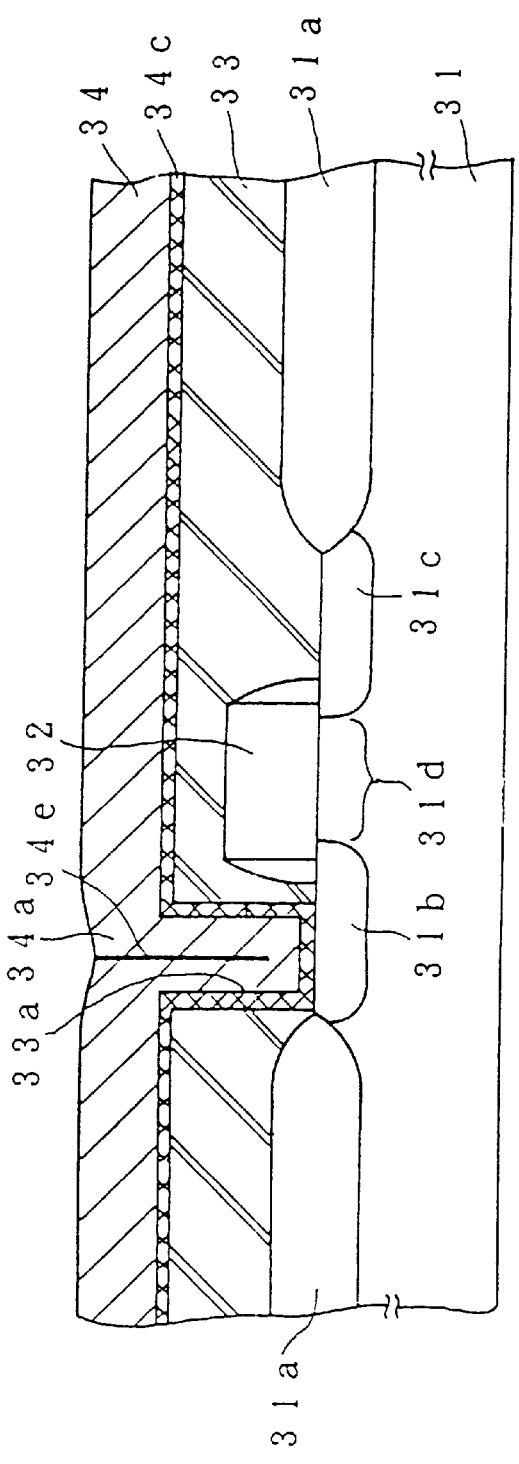

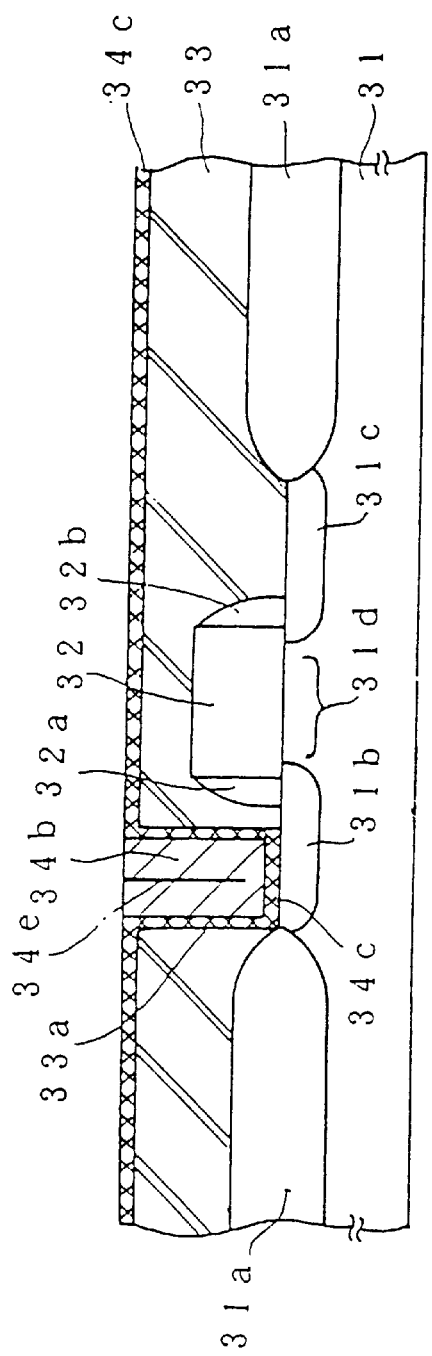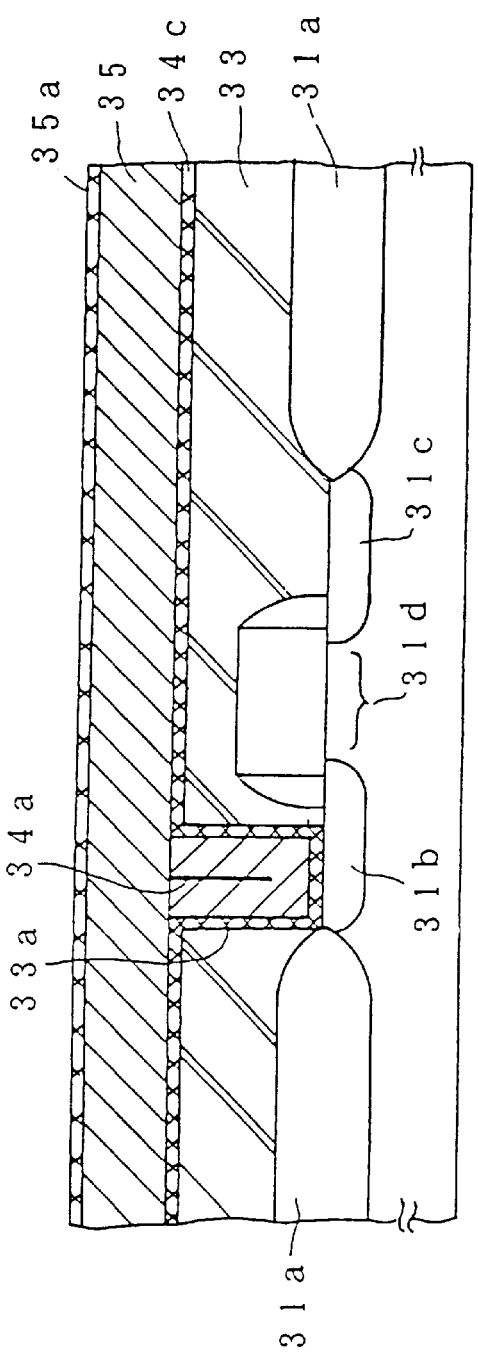
FIG.9E
FIG.9F

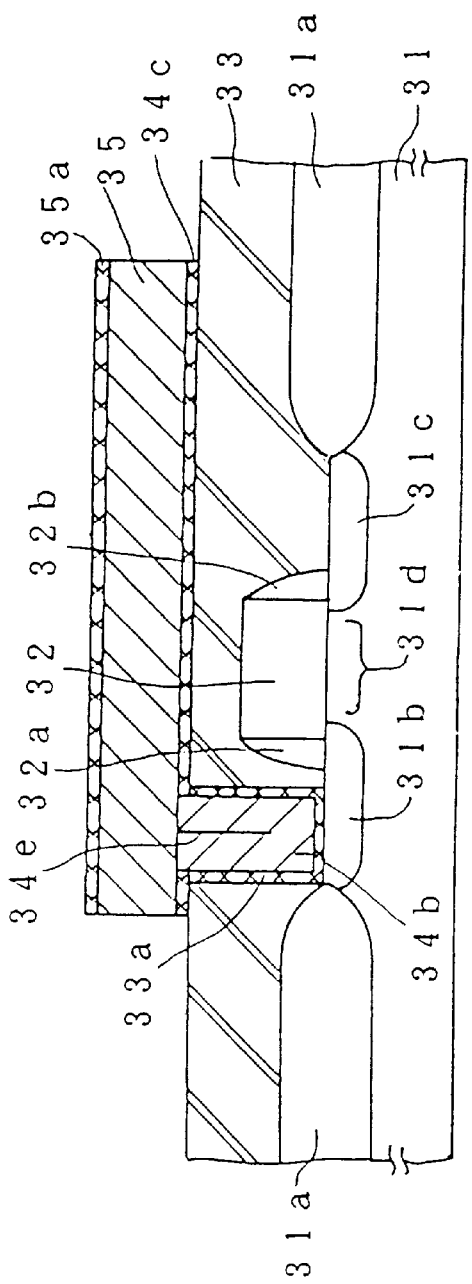
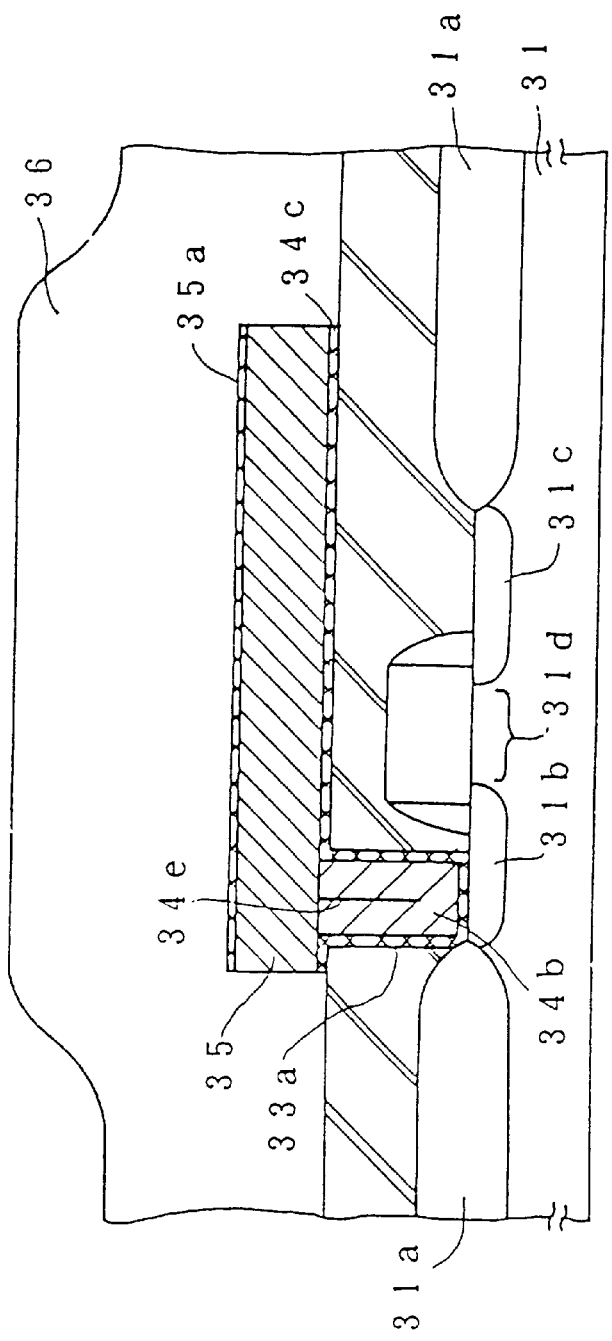
FIG. 9G
FIG. 9H

METHOD OF FABRICATING A SEMICONDUCTOR DEVICE USING A CMP PROCESS

BACKGROUND OF THE INVENTION

The present invention generally relates to fabrication of semiconductor devices and more particularly to a fabrication method of a semiconductor device using a CMP (chemical mechanical polishing) process and a polishing apparatus used for such a CMP process.

A CMP process is indispensable for fabricating so-called submicron semiconductor devices. Sub-micron semiconductor devices are integrated to form an integrated circuit having a very large scale integration density. In such very large scale integrated circuits, use of a multilayer interconnection structure is essential or inevitable for interconnecting various elements formed on a chip. When forming a multilayer interconnection structure, it becomes necessary to planarize each interlayer insulation film or interconnection layer that constitutes a part of the multilayer interconnection structure.

Conventionally, such a planarization process has been conducted by a CMP (chemical mechanical polishing) process using a colloidal silica slurry or an alumina slurry. A colloidal silica slurry can polish a $SiO_2$ film efficiently when used together with a liquid oxidant such as $H_2O_2$. Further, an alumina slurry is effective for polishing a conductor film such as W. Further, it is known that a ceria ($CeO_2$) slurry is effective for polishing an oxide film.

However, a ceria slurry is very expensive and the use thereof in a fabrication process of a semiconductor device is not practical. Further, a colloidal silica slurry or an alumina slurry is also expensive, and the use thereof increases the cost of the semiconductor device. There is an estimation that almost one-half of the cost of the CMP process per a wafer is for the cost of the slurry.

Further, it should be noted that the foregoing conventional slurries are used together with a liquid oxidant such as $H_2O_2$ in the CMP process as noted already, while the use of such a liquid oxidant tends to cause a problem, particularly when polishing a conductive plug filling a depression or a contact hole, in that a seam, which is formed in such a plug at the time of deposition of a metal layer so as to fill the contact hole, experiences a preferential corrosion as a result of the action of the liquid oxidant. When such a corrosion occurs in a conductive plug, the electrical contact at such a contact hole becomes inevitably unreliable.

Further, in such a conventional CMP process that uses a conventional slurry such as a colloidal silica slurry or an alumina slurry, or alternatively a ceria slurry, there has been a difficulty in removing the slurry from the wafer completely after the CMP process. In particular, the removal of the slurry becomes almost impossible once the slurry is dried up and solidified on the wafer. Because of this, it has been practiced to hold the wafer in water before and after the (CMP process. Even then, a mechanical cleaning process such as the one conducted in a brush scrubber has been indispensable for cleaning the wafer after the CMP process. As will be understood easily, such a mechanical cleaning process tends to cause a damage to the wafer on which semiconductor devices are already formed. In other words, there has been a danger in that the yield of production of the semiconductor device may be reduced as a result of such a mechanical cleaning process.

On the other hand, there has been a proposal to use a slurry containing $MnO_2$ abrasives for the planarization of a multilayer interconnection structure in the U.S. patent application Ser. No. 08/674,507, now U.S. Pat. No. 5,763,265 and Ser. No. 08/763,051, which are incorporated herein as reference. Under a normal polishing condition, the $MnO_2$ abrasives act preferentially upon a conductor layer such as W. By using the slurry, therefore, it is possible to stop the polishing exactly and promptly upon the exposure of an oxide film underneath the conductor layer. Further, the proposed slurry has an advantageous feature in that it does not require a liquid oxidant such as $H_2O_2$, as the $MnO_2$ abrasives themselves act as a solid oxidant. Thus, the slurry does not cause the problem of seam corrosion. Further, it was discovered, as in the U.S. patent application Ser. No. 08/674,507, op cit., that the $MnO_2$ abrasives can be used also for polishing an oxide film, by optimizing the polishing condition.

Further, it was discovered, as in the U.S. patent application Ser. No. 08/763,051, op cit., in that not only the $MnO_2$ abrasives but also abrasives of $Mn_2O_3$ and $Mn_3O_4$ are also effective for polishing an insulation film.

When using the slurry containing the abrasives of these various manganese oxides, there is a further advantageous feature in that the cleaning process after the polishing process is substantially simplified, as mentioned in the foregoing U.S. patent application Ser. Nos. 08/674,507 and 08/763,051. More specifically, it is possible to remove the remaining abrasives from the wafer completely after the polishing process, by merely immersing the wafer in an acid bath to which the manganese abrasives are soluble. As $MnO_2$ is used extensively for the material of a dry cell, the material is mass produced and is readily available. Further, the property of manganese oxide is studied thoroughly in relation to the foregoing extensive industrial use of the material.

It is noted that the manganese oxide abrasives tend to dry up faster than conventional colloidal silica abrasives. However, such a drying up of the abrasives does not cause any serious problem at all, as the abrasives thus adhered to and dried up on a polishing apparatus can be easily dissolved to an acid, provided that the construction of the polishing apparatus is optimized for such an acid cleaning process.

FIGS. 1A and 1B show the construction of a conventional. CMP apparatus 10 designed for use of a conventional slurry that uses conventional abrasives of colloidal silica, alumina or ceria, wherein FIG. 1A shows a side view of the CMP apparatus while FIG. 1B shows a plan view.

Referring to FIGS. 1A and 1B, the CMP apparatus 10 includes an inlet-side wafer carrier 1A for holding unprocessed wafers 11A in a water tank 1 and an outlet-side wafer carrier 1B for holding processed wafers 11B also in the same water tank 1. Further, there is provided a robot 1C in the tank 1 carrying a robot arm 1D, such that the robot 1C takes up a wafer 11A on the wafer carrier 1A by sucking a top surface thereof, wherein the robot 1C forwards the wafer 11A to a load/unload robot 2A that cooperates with a polishing section 2, which forms a part of the polishing apparatus and provided adjacent to the tank 1. Further, the robot 1C takes up a processed wafer from the load/unload robot 2A by sucking a top surface thereof. The robot 1C thereby elevates the robot arm 1D together with the processed wafer and causes the arm 1D to swing as indicated in FIG. 1B. Thereafter, the robot 1C lowers the arm 1D and moves the same along a horizontal shaft 1C' in the direction indicated by arrows.

On the other hand, the foregoing load/unload robot 2A includes arms 2a and 2b movable in up and down directions, and the respective arms 2a and 2b carry trays 2c and 2d for holding a wafer thereon. It should be noted that the arms 2a and 2b are movable to and from the robot 1C in the tank 1 as indicated by an arrow in FIG. 1B and further movable parallel to the drive shaft 1C' of the robot 1C.

Thus, the robot arm 1D is elevated, after picking up an unprocessed wafer 11A from the carrier 1A, to a high position when loading the wafer to the load/unload robot 2A, and the wafer thus held on the arm 1D is placed upon the tray 2c or the tray 2d that is also elevated to a corresponding high position for receiving the wafer 11A. Similarly, a processed wafer on the tray 2c or 2d is picked up by the robot arm 1D when unloading the processed wafer from the load/unload robot 2A.

The CMP apparatus 10 of FIGS. 1A and 1B further includes a platen 3B in the polishing section 2, such that the platen 2 is driven by a motor 3A. Further, the polishing section 2 includes a polishing head 3D driven by another motor 3C, such that the polishing head 3D faces the platen 3B. The head 3D is held on a pillar 3 movably in up and down directions and is loaded with a wafer W from the tray 2c or 2d of the load/unload robot 2A. The head 3D thereby urges the wafer TW thereon against a polishing cloth 3b covering the platen 3B with a predetermined pressure. Thus, the pillar 3 includes a mechanism for causing the head 3D to move up and down.

After polishing, the wafer is returned from the polishing head 3D to the tray 2c or 2d not used in the foregoing loading process. The wafer is then transported to the wafer carrier 1B.

It is possible to operate the CMP apparatus with only one of the arms 2a and 2b. However, use of both arms 2a and 2b increases the efficiency of the polishing operation. As the arms 2a and 2b are movable in the direction parallel to the drive shaft 1C' independently no problem of collision occurs when a wafer on the lower tray 2d is loaded on the head 3D or unloaded thereto from the head 3D.

Further, the CMP apparatus 10 includes a tank 12A for holding a slurry, a slurry feed line 12B connected to the tank 12A for feeding the slurry in the tank, and a drip nozzle 12C provided at an end of the feed line 12B for causing a dripping of the slurry thus supplied thereto on the platen 3B. The slurry thus fed to the platen 3B is then drained from a drain outlet 3E provided underneath the platen 3B.

The conventional CMP apparatus of FIGS. 1A and 1B, however, is designed for a CMP process that uses a conventional slurry such as a colloidal silica slurry or alumina slurry, or alternatively a ceria slurry. Thus, the CMP apparatus lacks the mechanism and capability of acid cleaning process, which should be extremely effective for removing a slurry when applied after the CMP process conducted by a manganese oxide slurry. As explained already, the slurry using a manganese oxide tends to dry up easily as compared with other conventional slurries. Thus, there is a demand for such a CMP apparatus having a feed system for supplying a slurry and further a cleaning system for supplying an acid to the platen on which the polishing is carried out.

SUMMARY OF THE INVENTION

Accordingly, it is a general object of the present invention to provide a novel and useful polishing apparatus for a CMP process and a fabrication process of a semiconductor device using such a polishing apparatus.

Another and more specific object of the present invention is to provide a polishing apparatus for a CMP process using a slurry of manganese oxide as well as a fabrication process of a semiconductor device using such a polishing apparatus.

Another object of the present invention is to provide a fabrication process of a semiconductor device including a polishing process, comprising the steps of:

polishing a substrate in a polishing apparatus by using a slurry that contains a manganese oxide as an abrasive; and cleaning, after said polishing step, said substrate and said polishing apparatus by an acid.

Another object of the present invention is to provide a polishing apparatus, comprising:

a rotatable platen;

first driving means for causing said rotatable platen to rotate;

a polishing head provided above said platen rotatably, said polishing head holding a substrate in a manner such that said substrate faces said platen;

second driving means for causing said polishing head to rotate;

urging means for urging said substrate on said polishing head against said platen;

a slurry feeding system for feeding a slurry to said platen; and a cleaning system for supplying a cleaning liquid containing an acid that dissolves a manganese oxide, to said polishing head;

said cleaning system including a nozzle provided in said polishing head for spraying said cleaning liquid to said platen.

According to the present invention, it is possible to clean both the polishing apparatus and the substrate after a CMP process conducted by a slurry containing a manganese oxide such as $MnO_2$, $MnO_2O_3$ or $Mn_3O_4$, by carrying out the cleaning process by an acid such as perchloric acid to which the manganese oxide is soluble. By building a shower nozzle of the cleaning liquid inside the polishing head, in particular, it is possible to dissolve and remove the slurry remaining on the platen easily in the state that the substrate is unloaded from the polishing head. Further, by forming the feed line of the slurry extending from a slurry tank to the platen and the feed line of the cleaning liquid from a cleaning liquid tank to the platen by a common feed line, with a switching valve provided for selectively connecting the feed line to one of the tanks, it is possible to remove any clogging in the feed line caused by a dried slurry, by merely feeding the cleaning liquid to the feed line.

Further, the present invention allows an efficient cleaning of the polished substrate by providing a tray used for loading and unloading of the substrate to and from the polishing head, such that the tray holds therein the cleaning liquid. By immersing the substrate in the cleaning liquid in the tray after the polishing process, the slurry adhered to the substrate is effectively and selectively dissolved.

Other objects and further features of the present invention will become apparent from the following description when read in conjunction with the attached drawings.

BRIEF DESCRIPTION OF THE DRAWINGS

FIGS. 9A–9I are diagrams showing a fabrication process of a semiconductor device using the CMP apparatus according to a third embodiment of the present invention.

DETAILED DESCRIPTION OF THE PREFERRED EMBODIMENTS

Figure 2:
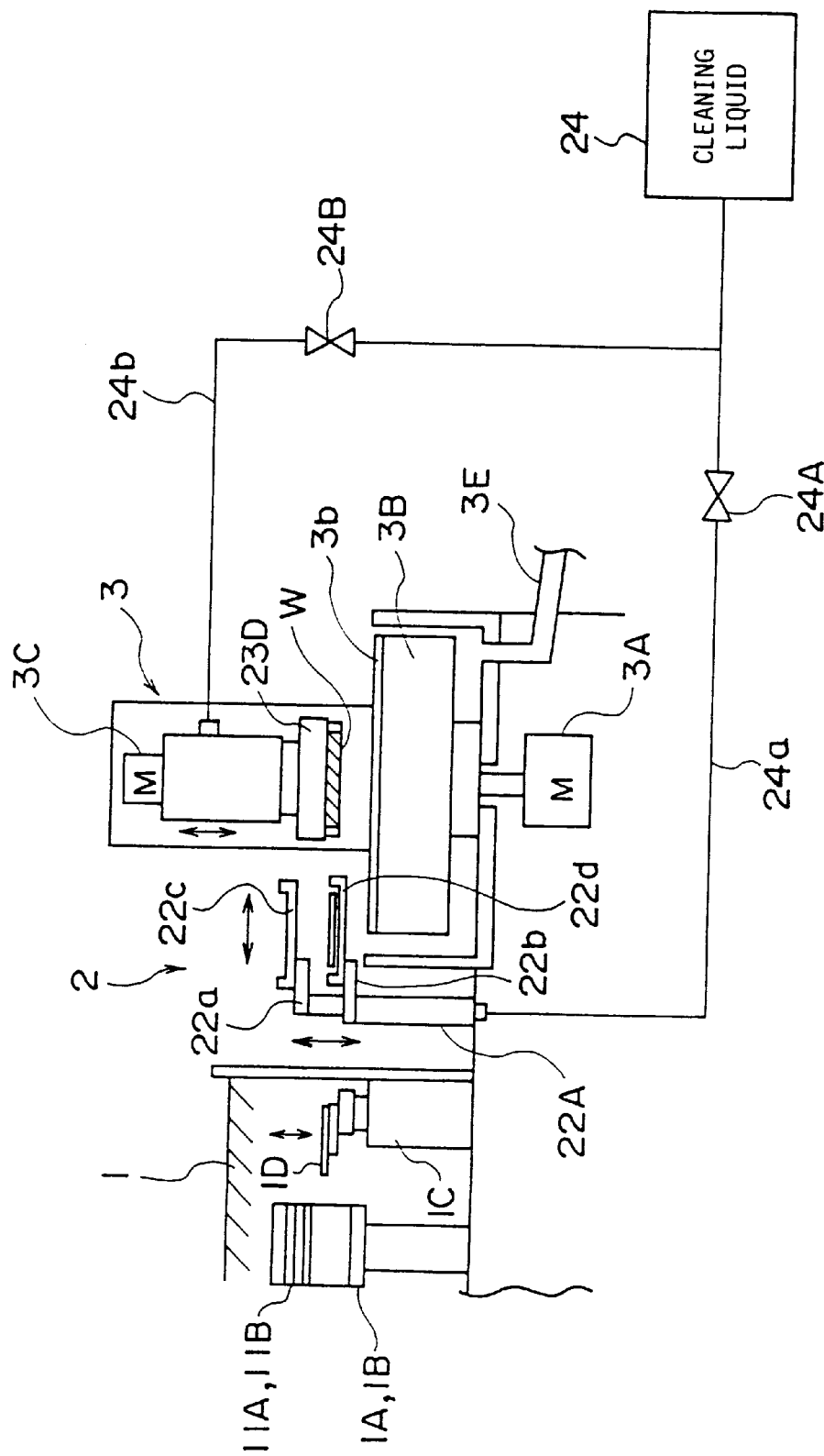
FIG. 2 is a diagram showing the construction of a CMP apparatus according to a first embodiment of the present invention.
Figure 3:
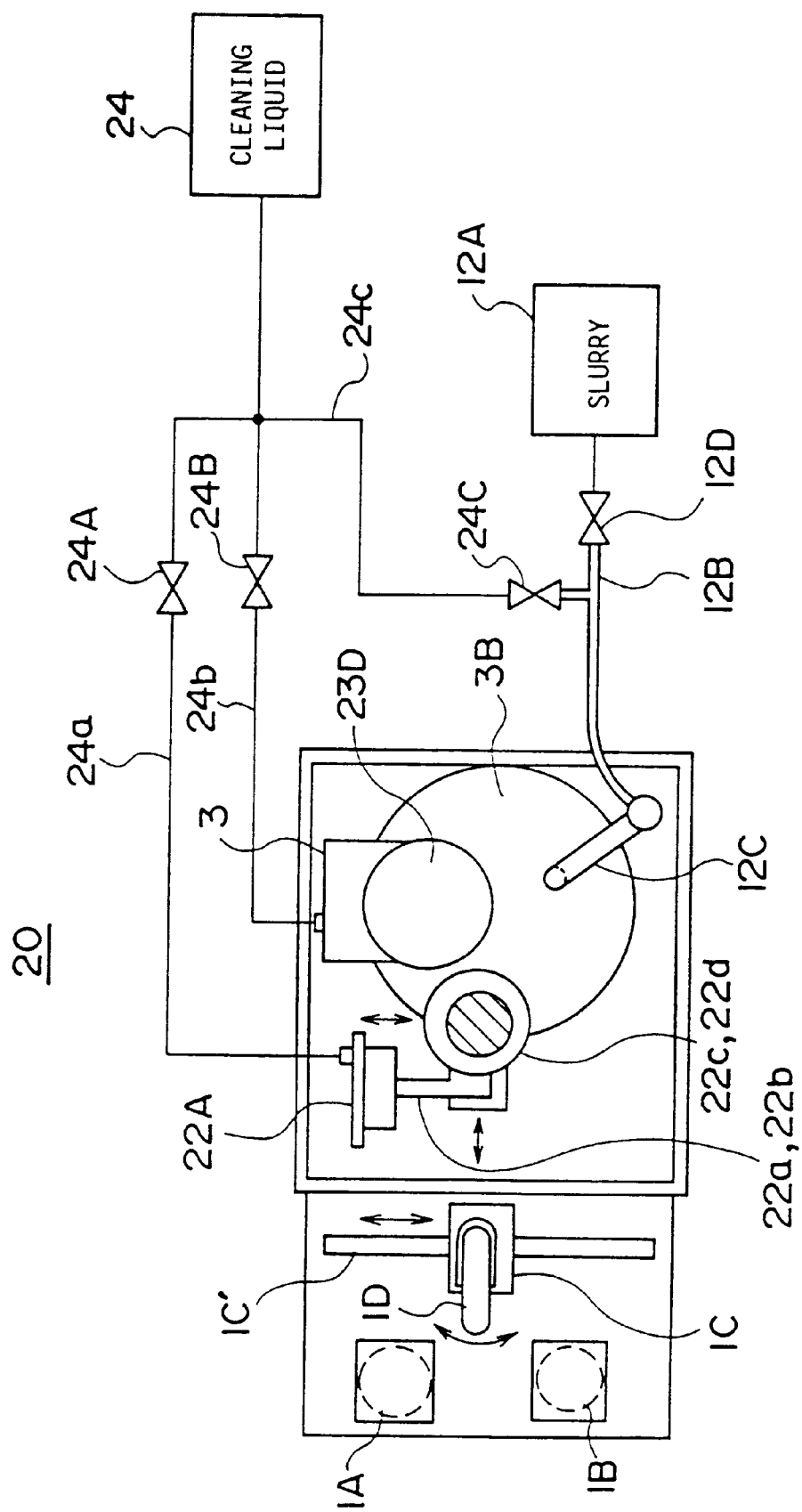
FIG. 3 is a diagram showing a part of FIG. 2 in detail.

FIGS. 2 and 3 show the construction of a CMP apparatus 20 according to a first embodiment of the present invention, wherein those parts explained previously are designated by the same reference numerals and the description thereof will be omitted.

Figure 1A:
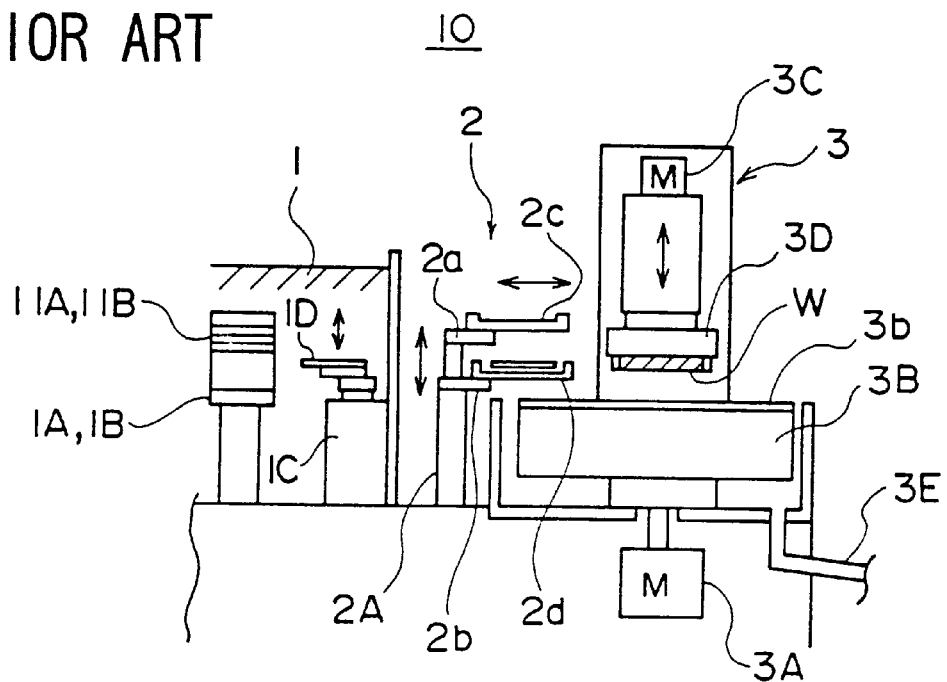
FIGS. 1A and 1B are diagrams showing the construction of a conventional CMP apparatus.
Figure 1B:
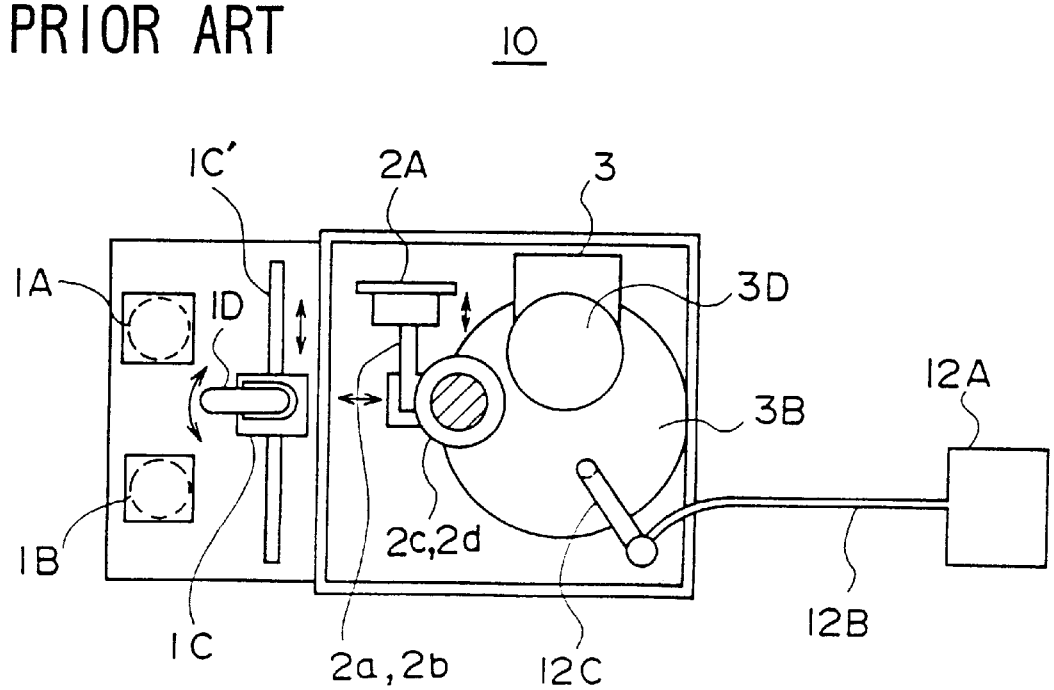

Referring to FIGS. 2 and 3, the CMP apparatus 20 includes a tank 24 for holding perchloric acid, wherein the tank 24 supplies the perchloric acid therein to a transfer robot 22A corresponding to the transfer robot 2A of FIGS. 1A and 1B, by way of a valve 24A and a corresponding feed line 24a. Further, the tank 24 supplies the perchloric acid to a polishing head 23D corresponding to the polishing head 3D explained previously, by way of a valve 24B and a corresponding feed line 24b. Further, as indicated in FIG. 3, the tank 24 supplies the perchloric acid therein to a slurry feed line 12B by way of a valve 24C, and another valve 12D is interposed between the slurry feed line 12B and the tank 12A.

The transfer robot 22A has arms 22a and 22b respectively corresponding to the arms 2a and 2b of the robot 2A, wherein the arm 22a carries thereon a tray 22c corresponding to the tray 2c. Further the arm 22a carries a tray 22d corresponding to the tray 2d.

Figure 4:
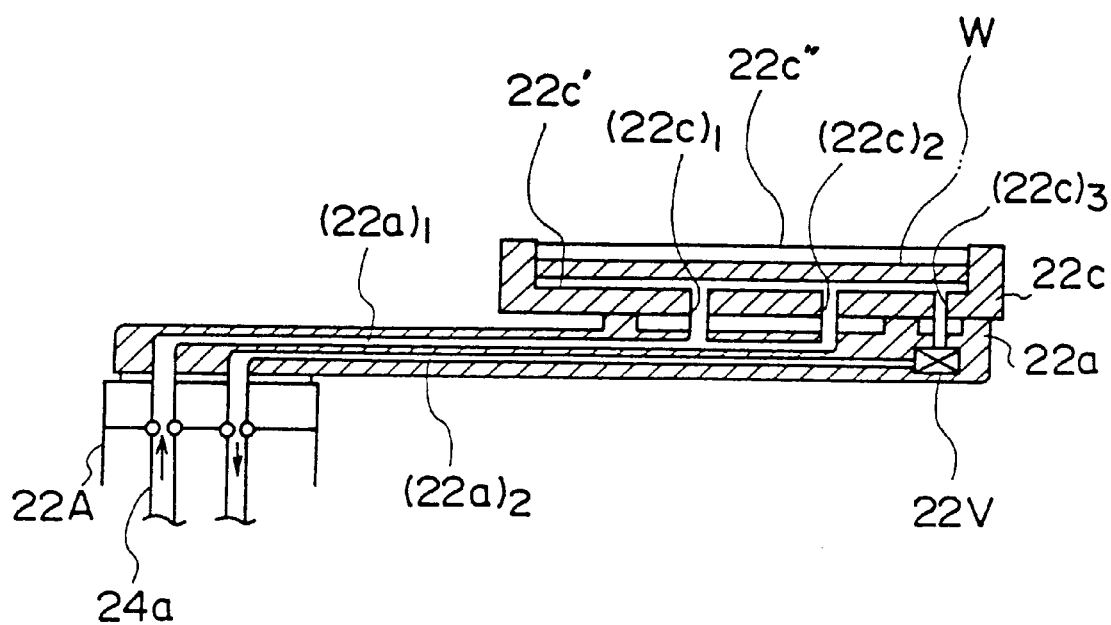
FIG. 4 is a diagram showing a further part of FIG. 3 in detail.

FIG. 4 shows the tray 22c in detail.

Referring to FIG. 4, there is provided a feed line 24a inside the robot 22A extending from the valve 24A for supplying the perchloric acid in the tank 24, wherein the perchloric acid thus supplied fills a depression 22c' formed on the tray 22c after passing through a passage $(22a)_1$ formed in the arm 22a and further through holes $(22c)_1$ and $(22c)_2$ formed in the tray 22c in communication with the foregoing passage $(22a)_1$.

It should be noted that the depression 22c' is used for holding the wafer W when loading or unloading the wafer W to and from the polishing head 23D. Thus, by filling the depression 22c' by perchloric acid, the wafer W held on the tray 22c is inevitably immersed in the perchloric acid. As a result, the manganese oxide slurry adhered to the polished wafer W is effectively dissolved. In FIG. 4, a line 22c" indicates the water level of the perchloric acid filling the depression 22c'.

Further, the tray 22c is formed with a drain hole $(22c)_3$ at the distal end part of the arm 22a in communication with a drain passage $(22a)_2$ formed in the arm 22a via a valve 22V provided in the arm 22a. Thus, by opening the valve 22V, the perchloric acid in the depression 22c' is drained via the drain hole $(22c)_3$ and the passage $(22a)_2$. In the present construction in which the drain hole $(22c)_3$ is formed at the distal end of the arm 22a, it is possible to increase the efficiency of draining by causing the arm 22a to swing.

A similar construction is provided also for the tray 22d. As a result of sucn a construction, the wafer W returned to the tray 22c or 22d after the polishing on the head 23D is effectively cleaned by the action of the perchloric acid solution that dissolves the adhered manganese oxide on the wafer W.

Figure 5:
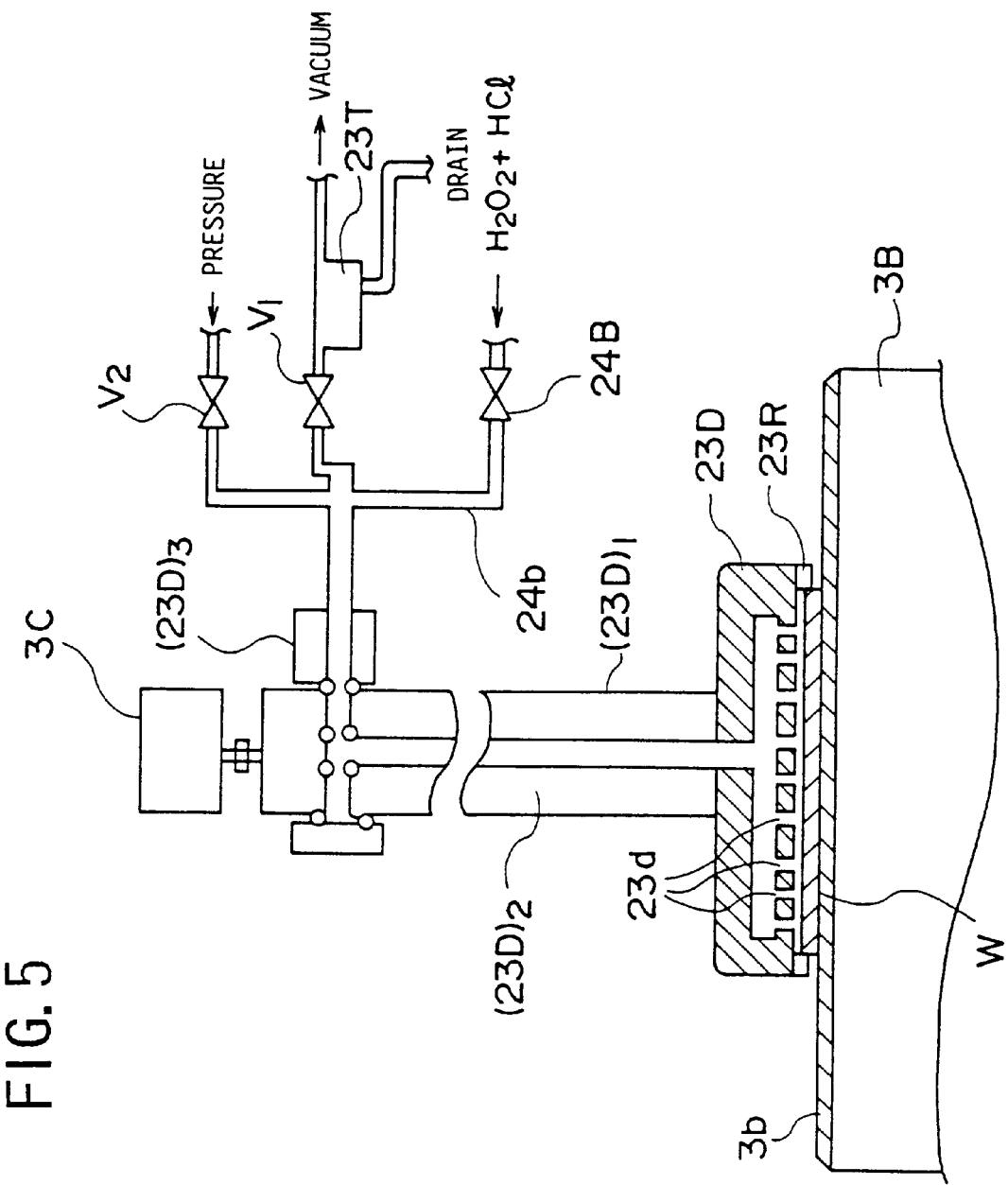
FIG. 5 is a diagram showing another part of FIG. 3 in a polishing mode.

FIG. 5 shows the construction of the polishing head 3D.

Referring to FIG. 5, the head 23D is formed with a number of small apertures 23d forming a vacuum chuck similarly to the conventional polishing head 3D, wherein the apertures 23d are communicated to a passage $(23D)_2$ formed in a column $(23D)_1$ that is rotated by the motor 3C integrally with the head 3D. The passage $(23D)_2$, in turn, is connected to a vacuum pump (not shown) via a rotary valve $(23D)_3$ and a valve $V_1$, wherein the polishing head 23D sucks the wafer W as a result of the suction through the apertures 23d. Further, the illustrated construction includes a trap 23T adjacent to the valve $V_1$ as usual.

In the polishing mode shown in FIG. 5, it should be noted that the lateral displacement of the wafer W on the head 23D is restricted by a retention ring 23R, and the wafer W rotates integrally with the head 23D. Thereby, the wafer engages with the polishing cloth 3b covering the platen 3B and experiences a polishing as a result of such an engagement. As noted below, the polishing cloth 3b is supplied with a slurry of a manganese oxide.

In the construction of FIG. 5, it should further be noted that there is provided a valve $V_2$ for supplying a compressed air to the foregoing apertures 23d via the passage $(23D)_2$, when unloading the wafer W from the head 23D, for facilitating the disengagement of the wafer W from the head, similarly to the conventional polishing head 3D.

In the present embodiment, the valve 24B and the feed line 24b are connected to the foregoing rotary valve $(23D)_3$. Thus, the perchloric acid in the tank 24 is supplied to the apertures 23d after passing the rotary valve $(23D)_3$ and the passage $(23D)_2$ in the cleaning mode, in response to the opening of the valve 24B.

Figure 6:
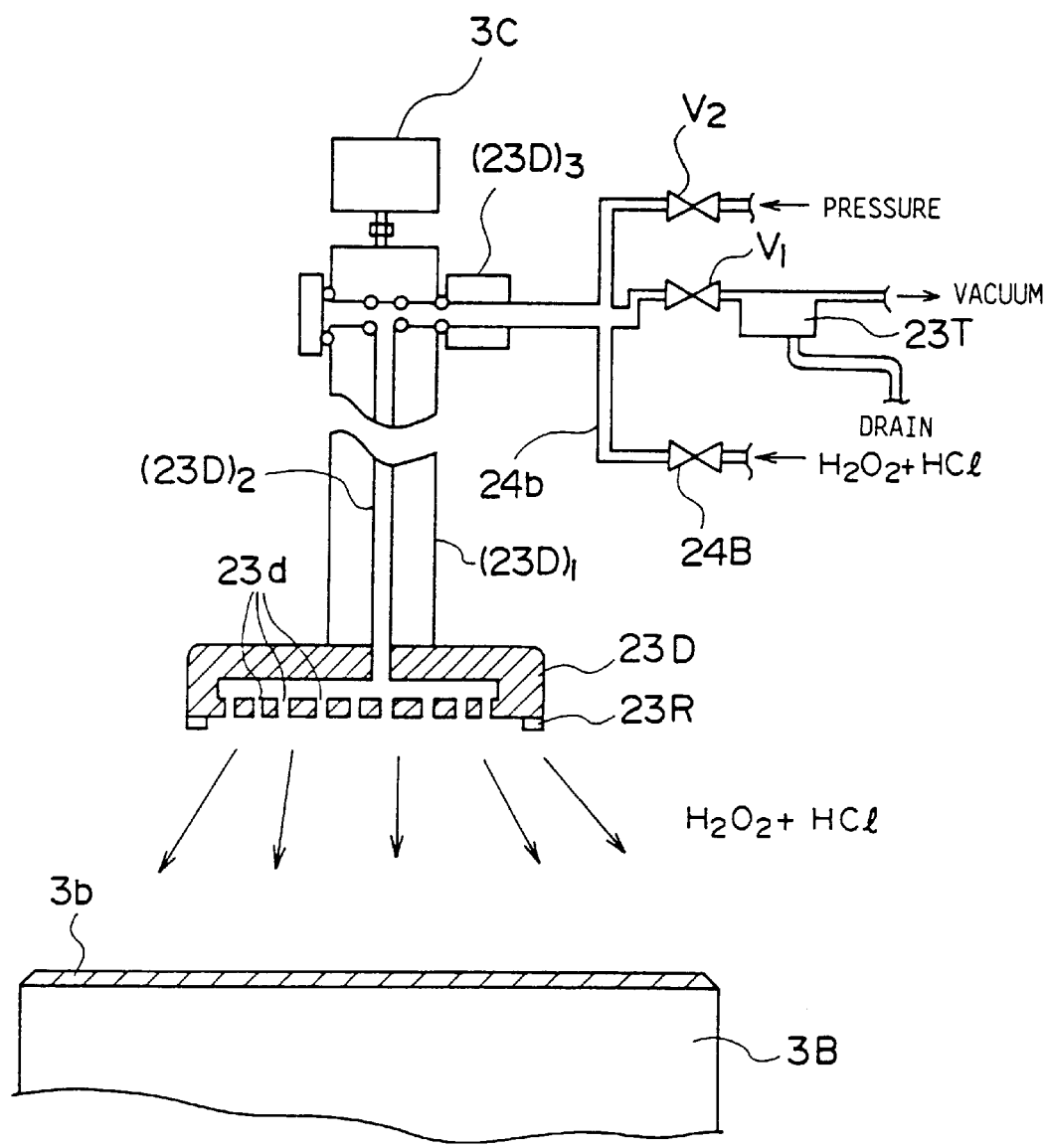
FIG. 6 is a diagram showing the part of FIG. 5 in a cleaning mode.

FIG. 6 shows the polishing head 23D in the cleaning model.

Referring to FIG. 6, the wafer W is already transferred to the tray 22c or 22d of the load/unload robot 22A, and the polishing head 23D is moved in the upward direction away from the platen 3B by the elevating mechanism provided on the pillar 3. Alternatively, the platen 3B may be lowered by a mechanism not illustrated.

In the state of FIG. 6, the valves $V_1$ and $V_2$ are all closed, and only the valve 24B is opened. As a result, the cleaning liquid of perchloric acid supplied through the feed line 24b is sprayed on the platen 3B, and the manganese oxide remaining on the platen 3B or the polishing cloth 3b covering the platen 3B is; effectively dissolved. Such a cleaning of the platen 3B may be conducted for each of the wafers or every predetermined number of wafers.

Figure 7:
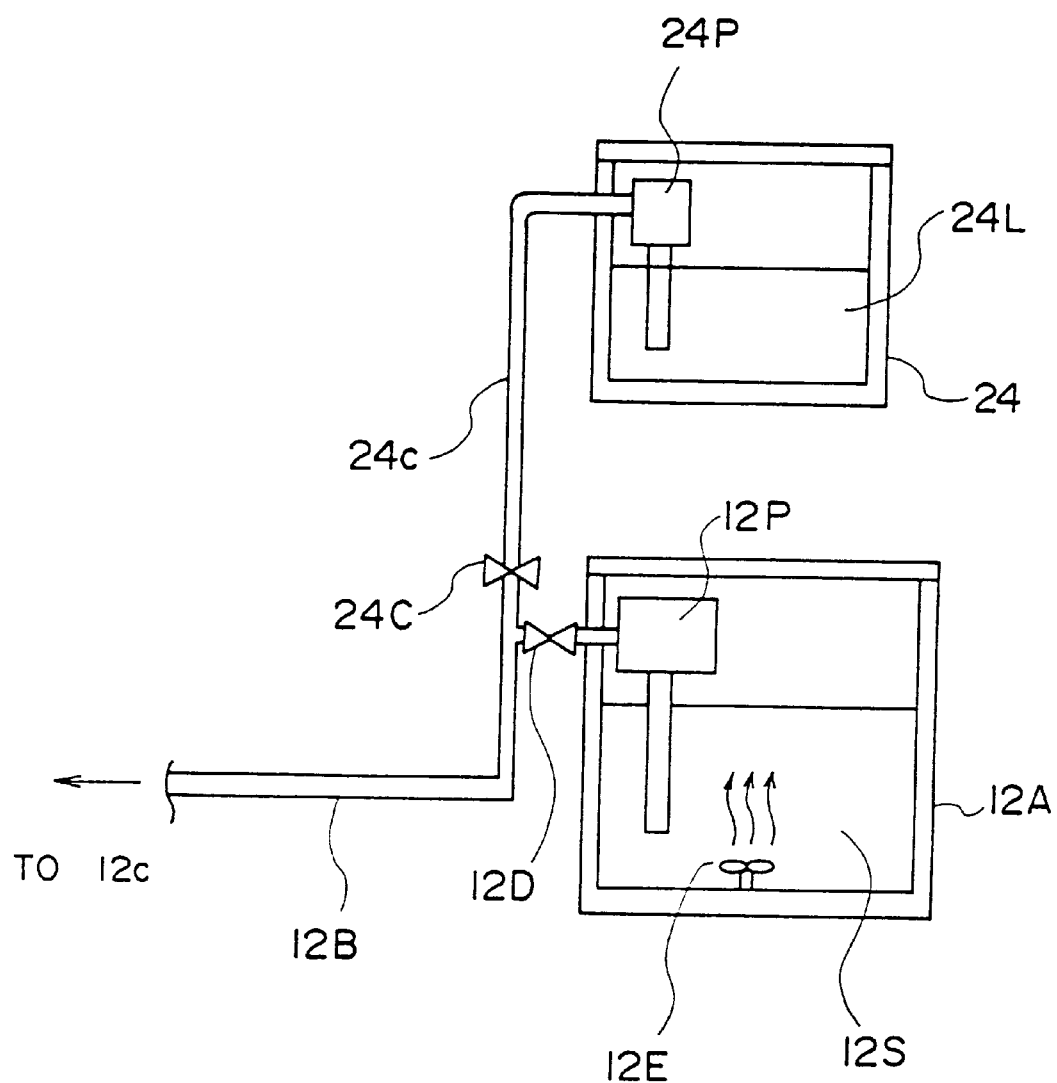
FIG. 7 is a diagram showing still another part of FIG. 3 in detail.

FIG. 7 shows the construction, used in the CMP apparatus 20 of FIG. 3, for selectively supplying one of a manganese oxide slurry 12S in the tank 12A and a cleaning liquid 24L of perchloric acid in the tank 24 to the drip nozzle 12C.

Referring to FIG. 7, the tank 12A for the slurry includes an agitator 12E. The agitator 12E agitates the slurry continuously and the separation of solid phase and the liquid phase is successfully avoided in the tank 12A. In the polishing mode of the CMP apparatus 20, the agitated slurry 12S is fed to the nozzle 12C by way of a pump 12P provided in the tank 12A, through the valve 12D and the line 12B.

Thus, when starting or restarting the CMP apparatus 20, the valve 12D is closed and the valve 24C is opened.

Thereby, the cleaning liquid 24L in the tank 24 is supplied to the feed line 12B by way of a pump 24P of the tank 24. As a result, any clogging of the feed line 12B or of the nozzle 12C by the dried slurry is effectively eliminated, and the supply of the slurry to the line 12B and the nozzle 12C is achieved reliably and stably.

Figure 8A:
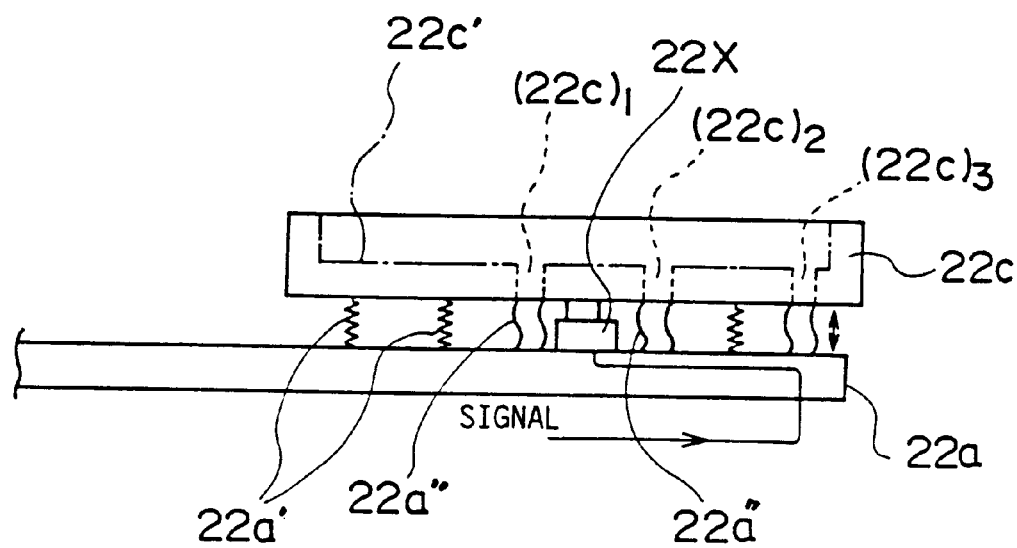
FIGS. 8A and 8B are diagrams showing a second embodiment of the present invention.
Figure 8B:
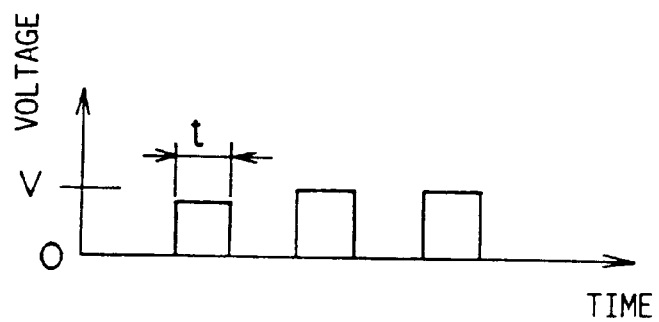

FIGS. 8A and 8B show the construction of the tray according to a second embodiment of the present invention, wherein those parts corresponding to the parts described previously are designated by the same reference numerals and the description thereof will be omitted.

Referring to FIG. 8A, the tray 22c of the present embodiment is held movably on the arm 22a by way of a spring 22a'. Thereby, the holes $(22c)_1$–$(22c)_3$ are connected to corresponding passages in the arm 22a by means of a flexible tube 22a". Further, there is provided an vibrator 22X on the arm 22a between the tray 22c and the arm 22a, and the vibrator 22X produces a drive signal of which waveform is shown in FIG. 8B for example. In response to the vibration thus produced, the tray 22c is vibrated, and the cleaning of the wafer W in the tray 22c is substantially facilitated.

Next, a fabrication process of a semiconductor device achieved by using the polishing apparatus described heretofore, will be described with reference to FIGS. 9A–9I as a third embodiment of the present invention.

Referring to FIG. 9A, a MOS transistor is formed on a Si substrate 31 doped to the p-type in correspondence to an active region 32A defined by a field oxide film 31a. More specifically, the MOS transistor includes a diffusion region 31b of the $n^+$-type formed on the surface of the active region 32A and another diffusion region 31c also of the $n^+$-type formed on the surface of the active region 32A, wherein the diffusion region 31b and the diffusion region 31c are separated from each other by a channel region 31d of the MOS transistor. On the substrate 31, there is provided a gate electrode 32 so as to cover the channel region 31d with an intervening gate oxide film (not shown). Further, the gate electrode 32 carries side wall insulation films 32a and 32b on respective opposing side walls. It should be noted that the diffusion regions 31b and 31c act respectively as a source and a drain of the MOS transistor.

In the step of FIG. 9A, an interlayer insulation film 33 of $SiO_2$ is deposited so as to bury the MOS transistor, typically with a thickness of about 50 nm. As a result of deposition of the interlayer insulation film 33, the gate electrode 32 as well as the diffusion regions 31b and 31c are covered by the $SiO_2$ film forming the interlayer insulation film 33. Thereby, the interlayer insulation film 33 shows a projection and a depression in conformity with the foregoing gate electrode 32.

Next, in the step of FIG. 9B, the structure of FIG. 9A is planarized by polishing the surface of the insulation film 33 uniformly by using the polishing apparatus of FIG. 2 described in the previous embodiment. in combination with a slurry containing manganese oxide abrasives such as $MnO_2$, $Mn_2O_3$ or $Mn_3O_4$. Further, in the step of FIG. 9C, the insulation film 33 is subjected to a photolithographic patterning process, in which a contact hole 33a is formed in the interlayer insulation film 33 so as to expose the surface of the diffusion region 31b.

After the step of FIG. 9C, a TiN film 34c is deposited upon the structure of FIG. 9C in the step of FIG. 9D as a diffusion barrier, such that the TiN film covers the upper major surface of the $Sio_2$ film 33 as well as the side wall of the contact hole 33a and further the exposed bottom surface of the diffusion region 31b. After the TiN film 34c is thus deposited, a conductor layer 34 is deposited thereon so as to fill the contact hole 33a as indicated in FIG. 9D. Thereby, a depression 34a is formed on the upper major surface of the conductor layer 34 in correspondence to the contact hole 33a. In such a structure, a seam 34e is formed commonly in the conductor layer 34 in correspondence to the contact hole 33a.

Next, the conductor layer 34 is polished in the step of FIG. 9E uniformly by using a slurry containing the manganese oxide abrasives, and a structure shown in FIG. 9E is obtained. In the process of FIG. 9E, the polishing stops spontaneously upon the exposure of the TiN film 34c. In other words, the TiN film 34c acts also as a polishing stopper. As a result of the planarization, achieved by the polishing process in cooperation with the polishing stopper layer 34c, the conductive plug 34b has an upper major surface coincident to the upper major surface of the TiN film 34c.

Next, in the step of FIG. 9F, an Al alloy (Al—Si—Cu alloy) layer is deposited on the TiN film 34c together with a thin intervening Ti film (not shown), as a conductor layer 35, and another TiN film 35a is sputtered upon the Al alloy layer 35 also with an intervening thin Ti film not illustrated.

In the step of FIG. 9G, the conductor layer 35 as well as the TiN films 34c and 35a sandwiching the layer 35 vertically are patterned by a photolithographic patterning process, to form a desired interconnection pattern.

Further, in the step of FIG. 9H, an interlayer insulation film 36 typically of $SiO_2$, PSG or BPSG, is deposited on the structure of FIG. 9G by a CVD process such that the insulation film 36 covers the wiring pattern 35 as well as the TiN film 35a thereon.

Figure 9I:
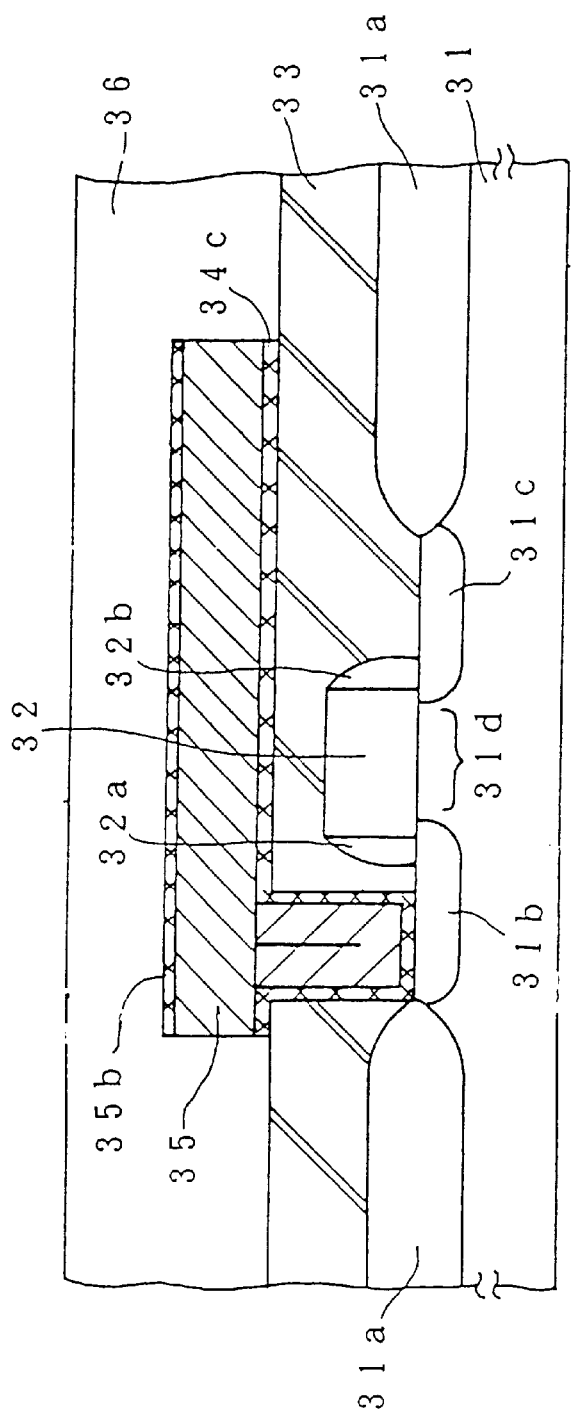

Finally, in the step of FIG. 9I, the interlayer insulation film 36 is planarized by a polishing process, which is preferably conducted by using the $MnO_2$ slurry, although a conventional colloidal silica slurry may be used also for this purpose.

Further, one may form any desired wiring pattern on the planarized surface of the insulation film 36.

In the present embodiment, a manganese oxide slurry containing an abrasive of $MnO_2$, $Mn_2O_3$ or $Mn_3O_4$ is used in the polishing step of FIGS. 9B, 9E and 9I. In these polishing steps, the manganese oxide abrasives are typically dispersed in the $H_2O$ solvent with a concentration of 7% by weight, and the polishing is made on a urethane cloth (IC1000) provided on the platen 3B, which in turn, is covered by an unwoven fabric cloth (SUBA400), wherein the polishing is made with a pressure of typically 2 kg/cm$^2$ while rotating the platen 3B at a rotational speed of 100 rpm and simultaneously rotating the wafer held on the polishing head 3D in the same direction at the same rotational speed.

By using the same slurry in the polishing steps of FIG. 9B, 9E and 9I, one can use the same polishing apparatus or facility and the fabrication cost of the semiconductor device is reduced substantially. Further, the sludge processing is substantially simplified.

In each of the polishing steps of FIG. 9B, FIG. 9E and FIG. 9I, the polished work (wafer W) is cleaned in the tray 22c or 22d of the CMP apparatus. As explained in FIG. 4. the tray 22c or 22d is filled with the cleaning liquid of perchloric acid, and any manganese oxide abrasives adhered to the wafer W is effectively dissolved. Further, the cleaning process shown in FIG. 6 may be carried out anytime whenever there arises a need for removing the adhered abrasives from the platen 3B or from the vicinities of the platen 3B. Further, the cleaning of the feed line 12B and the nozzle 12C is achieved each startup of the CMP apparatus 20 as explained already, by opening the valve 24C in the construction of FIG. 7.

In the description heretofore, use of perchloric acid is disclosed for the cleaning liquid. However, the present invention is by no means limited to such a particular cleaning liquid but any composition that can dissolve a manganese oxide such as a mixture of $H_2O_2$ and $H_2SO_4$ or perchloric acid may be used for the cleaning liquid.

Further, the present invention is by no means limited to the embodiments described heretofore, but various variations and modifications may be made without departing from the scope of the invention.

What is claimed is:

1. A method of fabricating a semiconductor device including a polishing process, comprising the steps of:

polishing a substrate in a polishing apparatus by using a slurry that contains a manganese oxide as an abrasive; and cleaning, after said polishing step, said substrate and said polishing apparatus simultaneously by an acid.

2. A method as claimed in claim 1, wherein said cleaning step includes a step of supplying said acid by a slurry feed system of said polishing apparatus, said slurry feed system being used for feeding a slurry to a platen of said polishing apparatus.

3. A method as claimed in claim 1, wherein said cleaning step includes a step of supplying said acid to a polishing head of said polishing apparatus, said polishing head being adapted to hold said substrate such that said substrate faces a platen of said polishing apparatus.

4. A method as claimed in claim 3, wherein said cleaning step includes a step of applying a shower of said acid to said platen from said polishing head.

5. A method as claimed in claim 1, wherein said polishing apparatus includes a load/unload mechanism of said substrate to and from said polishing head, and wherein said cleaning step includes a step of immersing said substrate in a bath of said acid in said load/unload mechanism after said polishing step.

6. A method as claimed in claim 5, wherein said cleaning step includes a step of mechanically vibrating said substrate in a state in which said substrate is immersed in said acid bath.

7. A method as claimed in claim 1, wherein said manganese oxide is selected from a group consisting of $MnO_2$, $Mn_2O_3$ and $Mn_3O_4$.

8. A method as claimed in claim 1, wherein said acid is a perchloric acid.

* * * * *